United States Patent [19]

Tobioka et al.

[11] 4,150,195

[45] Apr. 17, 1979

[54] SURFACE-COATED CEMENTED CARBIDE ARTICLE AND A PROCESS FOR THE PRODUCTION THEREOF

[75] Inventors: Masaaki Tobioka; Mitsuo Kodama; Minol Nakano; Takeshi Asai; Takaharu Yamamoto; Akio Hara, all of Itami, Japan

[73] Assignee: Sumitomo Electric Industries, Ltd., Osaka, Japan

[21] Appl. No.: 806,880

[22] Filed: Jun. 15, 1977

[51] Int. Cl.$^2$ ............................................. B22E 3/00
[52] U.S. Cl. ............................... 428/548; 75/203; 75/204; 75/208 R; 428/565
[58] Field of Search ............... 428/548, 565; 75/203, 75/204, 208 R

[56] References Cited

U.S. PATENT DOCUMENTS

| | | | |
|---|---|---|---|
| 3,147,542 | 9/1964 | Boeckeler | 485/565 |
| 3,313,660 | 4/1967 | Vordahl | 428/565 |
| 3,368,882 | 2/1968 | Ellis et al. | 428/565 |
| 3,999,954 | 12/1976 | Kolaska et al. | 428/565 |

*Primary Examiner*—Brooks H. Hunt
*Attorney, Agent, or Firm*—Wenderoth, Lind & Ponack

[57] ABSTRACT

This invention relates to surface-coated cemented carbide articles having a monolayer or multilayer consisting of one or more materials selected from oxides, carbides, nitrides and mixtures or compounds thereof, the most interior layer, in contact with the surface of the cemented carbide substrate, consisting of one or more materials selected from carbides and carbonitrides of Group IVa, Va and VIa elements, wherein the thickness of a decarburized layer ($\eta$ phase) present between the cemented carbide substrate and most interior coating layer is 0.5 micron or less in a case where the curvature of the interface is zero and the lattice constant of the binder metal of the coated cemented carbide article, as a mean value from the interface to 50 microns, is not more than that of the iron group metal solid solution by 0.005 Å or more.

7 Claims, 1 Drawing Figure

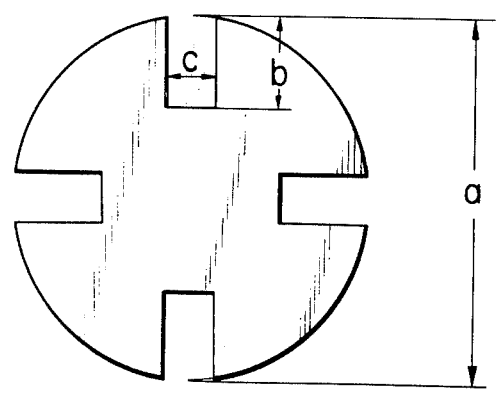

SURFACE-COATED CEMENTED CARBIDE ARTICLE AND A PROCESS FOR THE PRODUCTION THEREOF

BACKGROUND OF THE INVENTION

1. FIELD OF THE INVENTION

The present invention relates to surface-coated cemented carbide articles and a process for the production thereof and more particularly, it is concerned with cemented carbide articles or parts, for example, cutting tools having one or more coating layers of oxides, carbides and nitrides.

2. DESCRIPTION OF THE PRIOR ART

Cemented carbides are sintered products having suitable toughness and wear resistance containing one or more carbides and/or carbonitrides of one or more metals selected from titanium, zirconium, hafnium, vanadium, columbium, tantalum, chromium, molybdenum and tungsten, cemented by mainly one or more metals from the iron groups. In the case of using these cemented carbides as a cutting tool, it is an important problem to increase the wear resistance since the tool life depends on the wearing of its edge. A number of proposals have thus been made to coat the cemented carbides with one or more layers of carbides, nitrides or carbonitrides of titanium, zirconium and hafnium and oxides of aluminum and zirconium which have more excellent wear resistances than the cemented carbides, thus obtaining coated inserts excellent in not only toughness but also wear resistance. However, these proposals are not only directed to the increase of the number of coating layers or to the change of the variety of coating layers and do not serve to improve or keep well the toughness of the cemented carbides.

SUMMARY OF THE INVENTION

It is an object of the invention to provide surface-coated cemented carbide articles or parts having an excellent wear resistance whereby the above described disadvantages of the prior art can be overcome.

It is another object of the invention to provide cutting tools or cutting inserts excellent in toughness.

It is a further object of the invention to provide tungsten carbide base cemented carbide articles having multilayer coatings, which are useful for many purposes such as cutting tools, dies, valves, bearings and the like.

It is a still further object of the invention to provide a process for the production of surface-coated cemented carbide articles with an increased adhesive strength between the coating layer and cemented carbide substrate.

These objects can be attained by surface-coated cemented carbide articles having a monolayer or multilayer consisting of one or more materials selected from oxides, carbides, nitrides and mixtures or compounds thereof, the most interior layer, in contact with the surface of the cemented carbide substrate, consisting of one or more materials selected from carbides and carbonitrides of Group IVa, Va and VIa elements, wherein the thickness of a decarburized layer ($\eta$ phase) present between the cemented carbide substrate and most interior coating layer is 0.5 micron or less in a case where the curvature of the interface is zero and the lattice constant of the binder metal of the coated cemented carbide article, as a mean value from the interface to 50 microns, is not 0.005 Å more than that of the iron group metal solid solution.

BRIEF DESCRIPTION OF THE DRAWING

The accompanying drawing is to illustrate the principle and merits of the invention in greater detail and shows a cross sectional view of a workpiece to be cut used in a cutting test.

DETAILED DESCRIPTION OF THE INVENTION

We, the inventors, have made efforts to solve the problems of the prior art as described above and, consequently, have found that the toughness of a coating insert can largely be increased by the use of cemented carbides containing free carbon, which have been hitherto regarded as an inferior article. That is to say, it is found that, when cemented carbide substrates are coated with various carbides, nitrides, carbonitrides and oxides by the commonly used chemical vapor deposition method to acquire a knowledge concerning the adhesive strength of the coating layer to the cemented carbide substrate, the adhesive strength is lowered in the order of carbides, carbonitrides, nitrides and oxides, and carbides and carbonitrides are resistant to practical use, and furthermore, it is found that in the case of a multilayer, the problem is adhesion of the most interior coating layer to the cemented carbide substrate. The present invention is based on these findings.

In the surface-coated cemented carbide article of the present invention, the substrate or base member used consists of cemented carbides which are sintered products containing one or more materials selected from carbides and carbonitrides of one or more metals selected from titanium, zirconium, hafnium, vanadium, columbium, tantalum, chromium, molybdenum and tungsten, cemented by one or more metals selected from the iron group, that is, iron, nickel and cobalt, in general, in a proportion of up to 30% by weight. The most interior layer in contact with the cemented carbide substrate as described above consists of one or more materials selected from carbides and carbonitrides of Group IVa, Va and VIa elements and, in general, has a thickness of 0.1 to 10 microns, preferably, 0.1 to 6 microns. Group IVa elements include titanium, zirconium and hafnium, Group Va elements include vanadium, columbium and tantalum, and Group VIa elements include chromium, molybdenum and tungsten. In the surface-coated cemented carbide article of the present invention, the most interior layer in contact with the cemented carbide substrate consists of one or more materials selected from carbides and carbonitrides of Group IVa, Va and VIa elements, but the present invention will now be illustrated in detail as to titanium, that is, taking the case of titanium carbide, since this is substantially the same as the case of titanium carbonitride. Coating of a cemented carbide substrate with titanium carbide is generally carried out by the so-called chemical vapor deposition method wherein titanium carbide is precipitated at a high temperature, for example, at about 1000° C. from a gaseous mixture of a titanium halide such as titanium tetrachloride, hydrocarbon such as methane and hydrogen in a predetermined proportion.

The mechanism of the deposition reaction of titanium carbide by the above described chemical vapor deposition method is very complicated, but, as a simple reaction model, it can be represented by the following two stages, i.e., (1) formation of free metallic titanium and (2) carburization of the free metallic titanium:

$$TiCl_4 + 2H_2 \rightarrow Ti + 4HCl \quad (1)$$

$$Ti + C \rightarrow TiC \quad (2)$$

The carburization of free titanium according to the reaction formula (2) is carried out with the free carbon formed by the cracking of the hydrocarbon in the gaseous mixture and the carbon supplied from the cemented carbide substrate. If the concentration of the hydrocarbon in the gaseous mixture is low, therefore, the most part of the carbon necessary for forming titanium carbide is supplied by the diffusion of the carbon contained in the cemented carbide substrate and there is formed a brittle decarburized phase generally called $\eta$ phase directly under the titanium carbide coating layer, thus resulting in a marked lowering of the toughness of the coated insert. If the concentration of the hydrocarbon in the gaseous mixture is increased, on the other hand, the most part of the carbon necessary for forming titanium carbide is supplied from the gaseous phase and there can be obtained a coated insert substantially free from the above described $\eta$ phase, but the coated insert obtained in this way is lacking in adhesive strength between the titanium carbide coating layer and the cemented carbide substrate and, when cutting is carried out using this coated insert, there occurs flaking of the coating layer from the cemented carbide substrate to thus cause deterioration of the toughness.

The inventors have thought that in order to solve the problems of formation of the $\eta$ phase and flaking of the coating layer, it would be effective to accumulate carbon in the form of free carbon in the cemented carbide substrate, based on the assumption that the wear resistance of the surface-coated cemented carbide article of the invention is not so lowered even if a cemented carbide substrate containing free carbon is used because the wear resistance thereof is mainly due to the surface coating, although it is well known that the wear resistance of cemented carbides is generally deteriorated to a great extent if there is free carbon therein.

When a cemented carbide substrate containing free carbon is coated with titanium carbide by the chemical vapor deposition method based on the above described thought, it is found possible to prepare a surface-coated cemented carbide alloy having no $\eta$ phase and being substantially free from the problem of flaking of the coating layer. In this case, the absence of $\eta$ phase is limited to where the curvature of the interface between the titanium carbide coating layer and the cemented carbide substrate is zero and, in an edge portion where carbon is insufficiently supplied and the curvature is large, an $\eta$ phase is present correspondingly to the curvature. Furthermore, it is found that the free carbon serving to form titanium carbide in the cemented carbide substrate is that of up to 50 microns under the normal coating conditions according to the chemical vapor deposition method and it is desirable that free carbon is deposited up to a depth of at least 50 microns. The quantity of free carbon ranges preferably from 0.01 to 0.50% by weight, since if less than 0.01% by weight, the thickness of $\eta$ phase exceeds 0.5 micron resulting in deterioration of the toughness of the cemented carbide alloy, while if more than 0.50% by weight, the wear resistance after coating is deteriorated. The most preferable range is from 0.05 to 0.35% by weight. Analysis of the quantity of free carbon is carried out by the mixed acid decomposition method in which a sample is decomposed with a mixed acid of nitric acid and hydrofluoric acid and the residue is then analyzed and analysis of the quantity of carbon is carried out by the coulometric method.

When cemented carbides are coated with titanium carbide by the chemical vapor deposition method, in general, the thickness of the titanium carbide coating layer is so thin, for example, several microns that there are scarcely differences in the quantities of free carbon remaining after the coating, but there are some special cases as follows. In a case where the quantity of free carbon contained in the substrate is less than a certain quantity, after titanium carbide is coated by the chemical vapor deposition method, all the free carbon in the substrate is consumed for the formation of the titanium carbide coating layer, which looks as if a cemented carbide substrate containing no free carbon were used. In this case, however, the thickness of $\eta$ phase reaches several microns at an edge portion where the curvature is large, but, where the curvature is zero, the thickness of $\eta$ phase is only less than 0.5 micron due to sufficient supply of carbon. When the lattice constant of the binder phase metal up to a depth of 100 microns directly under the coating layer is measured by X-ray diffraction, taking the case of using cobalt as a binder phase metal for tungsten carbide base cemented carbides, it is 3.550 Å or less (lattice constant of pure Co: 3.545 Å) and thus it will clearly be understood that a free carbon-containing substrate is used, since the carbon serving to form the titanium carbide coating layer is substantially supplied from the free carbon and not from the carbon in the tungsten carbide. In practice, very ideal coated cemented carbides can be obtained when the $\eta$ phase is in a thickness of less than 0.5 micron and the lattice constant of the binder phase, measured by removing the titanium carbide layer from the coated cemented carbide, electrolytically removing the tungsten carbide phase by a thickness of 50 microns using a 10% solution of sodium carbonate and then subjected to X-ray diffraction, is not more than that of an iron group metal solid solution by 0.005 Å or more, that is, 3.550 Å or less as described above in the case of cobalt.

It is said that, when cemented carbides are heated for a long time at a high temperature such for example as in the case of effecting titanium carbide coating by the chemical vapor deposition method, $Co_3W$ is deposited in the binder phase to embrittle the cemented carbide, but the degree of deposition of $Co_3W$ depends on the quantity of carbon contained in the cemented carbide and $Co_3W$ is hard to be deposited when the quantity of carbon is large. In this respect, the present invention is very favourable.

As in the present invention, the free carbon in a cemented carbide substrate is consumed for the purpose of titanium carbide coating and, consequently, the concentration gradient of carbon including the free carbon occurs from the surface to the interior with a depth of 50 microns. When a cemented carbide substrate is coated with titanium carbide, a large hardness gradient is produced in the interior of the cemented carbide article and the toughness thereof is often deteriorated during practical cutting, because as well known in the art, the properties of cemented carbide articles, in particular, hardness is largely governed by the content of carbon. In such a case, it is sometimes desirable to effect a carbon diffusion and equalization treatment. To this end, a heat treatment should be carried out at a temperature of 950° to 1100° C., preferably 1000° to 1050° C. for a period of 0.5 to 10 hours, preferably 1 to 5 hours, since if less than 950° C. and 0.5 hour, carbon scarcely diffuses, while if more than 1100° C. and 10 hours, the binder phase metal accumulates in a large amount at the interface between the coating layer and the cemented carbide article, resulting in a marked deterioration of the wear resistance.

The foregoing illustration is limited to a monolayer coating only, but, in the present invention, as far as the most interior coating layer in direct contact with the surface of a cemented carbide substrate consists of one or more materials selected from the group consisting of carbides and carbonitrides of Group IVa, Va and VIa elements, one or more materials selected from the group consisting of various oxides, carbides, nitrides and mixtures of compounds thereof can further be coated onto the most interior layer to form a multilayer-coated cemented carbide article with the similar advantages. In this case, in order to increase the adhesive strength between these coating layers, it is more preferable to sandwich one or more intermediate layers having each an intermediate composition in between these coating layers. For example, when titanium nitride is selected for the most exterior coating layer and titanium carbide is selected for the most interior coating layer, titanium carbonitride is desirable for the intermediate layer and when aluminum oxide is selected for the most exterior layer and titanium carbonitride, for the most interior layer, titanium oxycarbonitride is desirable for the intermediate layer. The use of such an intermediate coating layer results in a larger adhesive strength of multilayer coating as compared with the case of using no intermediate layer.

Furthermore, where one or more oxide layers are coated, the following effects or advantages will be expected. For example, the wear resistance can largely be increased by coating the surface of a cemented carbide substrate with one or more oxides of elements belonging to Group III to VI of Periodic Table and being inert to the iron group metals up to about the melting point, such for example as magnesium oxide, beryllium oxide, thorium oxide, hafnium oxide, titanium oxide, zirconium oxide, chromium oxide, aluminum oxide or mixtures, compounds or solid solutions of aluminum with at least one of these oxides and ternary solid solutions of aluminum oxide, calcium oxide and silicon oxide, e.g., gehlenite. However, these coatings have a disadvantage of causing diffusion of oxygen in the cemented carbide substrate to thus embrittle the substrate. In order to overcome this disadvantage, there is proposed a technique wherein one or more of carbides, nitrides, carbonitrides of Group IVa, Va and VIa elements and those containing further oxygen are sandwiched in between the substrate and oxide layer and thus used as a bar to the diffusion of oxygen. For example, aluminum oxide is coated as the most exterior layer, titanium oxide as the intermediate layer and the above described carbide as the most interior layer.

These carbides, nitrides, carbonitrides and/or compounds containing further oxygen act as a bar to the diffusion of oxygen more effectively as the ratio of the nonmetallic components to the metallic components is increased and, when using a cemented carbide substrate containing free carbon, the above described ratio is largely increased to suppress diffusion of oxygen in the substrate, thus obtaining a cutting insert having a very high toughness. When coating with an oxide, for example, consisting mainly of aluminum oxide or zirconium oxide, it is more effective to use carbides such as titanium carbide or carbonitrides as the most interior layer in contact with the cemented carbide substrate and to use carbides, nitrides or carbonitrides of titanium containing oxygen as the interior layer in contact with the oxide layer, whereby the oxygen potential in the latter layer is increased and the oxygen inflow due to decomposition of the oxide layer is reduced or neglected.

The following examples are given in order to illustrate the present invention in detail without limiting the same.

EXAMPLE 1

A cemented carbide substrate (Form No. SNU 432) having the same composition as the commercially sold cemented carbide article ISO P-30 and containing 0.08% by weight of free carbon was heated at 1000° C. in a reactor of Inconel (commercial name of nickel base alloy made by Inco Co.), through which a gaseous mixture of 86% hydrogen, 7% of titanium tetrachloride and 7% of methane was passed under a pressure of 40 torr, to coat with titanium carbide in a predetermined thickness and thereafter the reactor was evacuated to 0.1 torr and held at 1000° C. for 3 hours. When, after cooling, the insert was taken, cut and examined, the substrate was coated with titanium carbide with a thickness of 5 microns and there was scarcely found $\eta$ phase at the interface between the cemented carbide substrate and the coating layer. The lattice constant of the cemented carbide article up to 100 microns from the interface was 3.547 Å.

The insert obtained in this way and a coated insert consisting of a commercially sold free carbon-free cemented carbide ISO P-30 (Form No. SNU 432) coated under the same conditions with titanium carbide in a thickness of 5 microns (hereinafter referred to as "ordinary TiC-coated insert") were then subjected to a cutting test under the following conditions:

Cutting Condition (1)

| | |
|---|---|
| Workpiece to be cut | SCM3 ($H_B$=280) |
| Cutting Speed | 170 m/min |
| Feed | 0.36 mm/rev |
| Depth of Cut | 2 mm |
| Cutting Time | 20 minutes |

The insert of the present invention had a flank wear of 0.23 mm, while the ordinary TiC-coated insert had a flank wear of 0.22 mm. There was hardly found a difference between them.

Cutting Condition (2)

| | |
|---|---|
| Workpiece having a shape as shown in the accompanying drawing (a = 500 mm, b = 125 mm, c = 15 mm) | SCM3 ($H_B$=280) |
| Cutting Speed | 100 m/min |
| Feed | 0.22–0.20 mm/rev |
| Depth of Cut | 4 mm |
| Cutting Time | 2 minutes |

When cutting was carried out 100 times under the above described conditions, the insert of the present invention showed a breakage ratio of 0%, while the ordinary TiC-coated insert showed a breakage ratio of 33%. It is apparent from this result that the insert of the present invention was more excellent in toughness.

EXAMPLE 2

Samples A to F of titanium carbide-coated cemented carbides (ISO P-30, Form No. TNMG 432 ENZ) as shown in Table 1 were prepared and then subjected to cutting test by the following cutting conditions:

Cutting Condition (3)

| Workpiece | S55C Forged Material ($H_B$=250) Size: $\phi$ 50 mm × 300 mm |
|---|---|
| Cutting Speed | 140 m/min |
| Feed | 0.40 mm/rev |
| Depth of Cut | 2-5 mm |

The results are also shown in Table 1.

| Sample No. | Free Carbon in substrate (Wt %) | Number of Workpieces Cut |
|---|---|---|
| A | 0.00 | 65 |
| B | 0.03 | 110 |
| C | 0.08 | 112 |
| D | 0.19 | 103 |
| E | 0.41 | 72 |
| F | 0.61 | 31 |

EXAMPLE 3

The same ISO P-30 cemented carbide substrate (Form No. TNMG 432 ENZ) containing 0.08% of free carbon, as used in Example 1, was heated at 950° C. in a reactor of Inconel, through which a gaseous mixture of 80% of hydrogen, 5% of zirconium tetrachloride, 5% of methane and 10% of nitrogen was passed under a pressure of 80 torr, to coat with zirconium carbonitride. When, after cooling, the coated insert was taken, cut and examined, the substrate was coated with zirconium carbonitride with a thickness of 5 microns and there was no $\eta$ phase.

When the resulting insert was then subjected to cutting test by Cutting Condition (2) of Example 2, 158 workpieces could be cut.

EXAMPLE 4

Two cemented carbide substrates (Form No. SNU 432) having the same composition as the commercially sold ISO P-30 cemented carbide and containing no free carbon (Sample No. G) and containing 0.15% of free carbon (Sample No. H) were respectively heated at 1000° C. in a reactor of Inconel (commercial name of nickel base alloy made by Inco Co.), through which a gaseous mixture of 86% of hydrogen, 7% of titanium tetrachloride and 7% of methane was passed at a pressure of 40 torr to coat the substrate with titanium carbide with a thickness of 5 microns and then a gaseous mixture of 80% of hydrogen, 3% of carbon dioxide, 12% of carbon monoxide and 5% of aluminum chloride was passed at a pressure of 20 torr to form a coating of aluminum oxide with a thickness of about 1.5 microns.

When the thus resulting coated inserts were then subjected to cutting test by Cutting Condition (1) of Example 1, Sample G had a flank wear of 0.21 mm and Sample H had a flank wear of 0.22 mm. There was hardly found a difference between them.

When cutting was carried out 100 times under Cutting Condition (2) of Example 1 using these inserts, Sample G showed a breakage ratio of 67%, while Sample H showed a breakage ratio of 5%. It is apparent from this result that the insert of the present invention was more excellent in toughness.

EXAMPLE 5

The same ISO P-30 cemented carbide substrate (Form No. TNMG 432 ENZ) containing 0.08% of free carbon, as used in Example 1, was heated at 1000° C. in a reactor of Inconel, through which a gaseous mixture of 86% of hydrogen, 7% of titanium tetrachloride and 7% of methane was passed under a pressure of 40 torr, then a gaseous mixture of 80% of hydrogen, 7% of titanium tetrachloride, 7% of methane and 10% of nitrogen was passed under a pressure of 80 torr and further a gaseous mixture of 70% of hydrogen, 7% of titanium tetrachloride and 23% of nitrogen was passed under a pressure of 80 torr, and thereafter the reactor was evacuated to 0.1 torr and held at 1000° C. for 3 hours. When, after cooling, the insert was taken, cut and examined, the substrate was coated with titanium carbide of 2 microns, titanium carbonitride of 3 microns and titanium nitride of 1 micron from the inside (Sample No. I).

In an analogous manner, another insert for cutting (Sample No. J), coated with titanium carbide of 2 microns and titanium nitride of 4 microns from the inside, was prepared.

When these inserts were then subjected to cutting test by Cutting Condition (3) of Example 2, Sample No. I was capable of cutting 143 workpieces and Sample No. J was capable of cutting 91 workpieces.

EXAMPLE 6

The same substrate as used in Example 4 was coated with titanium carbide in a thickness of 3 microns and then with zirconium oxide in a thickness of 1 micron in an analogous manner to Example 4 to prepare an insert.

In the case of the substrate containing no free carbon, a brittle $\eta$ phase with a thickness of 6 microns was formed between the substrate and lower layer, while in the case of the substrate containing free carbon, there was no $\eta$ phase.

EXAMPLE 7

The same substrate as used in Example 2 was coated with titanium carbide in a thickness of 3 microns in an analogous manner to Example 1 and then with gehlenite (calcium oxide-aluminum oxide-silicon oxide compound) in a thickness of 2 microns.

In the case of the substrate containing free carbon, there was found no $\eta$ phase between the substrate and lower layer, but in the case of the substrate containing no free carbon, there was found $\eta$ phase with a thickness of 4 microns.

EXAMPLE 8

The same ISO P-30 cemented carbide substrate (Form No. SNU 432) containing 0.08% of free carbon, as used in Example 1, was coated with titanium carbide in a thickness of 5 microns in a reactor of Inconel (commercial name of nickel base alloy made by Inco Co.) under the same conditions as in Example 1 and through the same reactor was then passed a gaseous mixture of 7% of titanium tetrachloride, 3.5% of methane, 3.5% of carbon monoxide and the balance hydrogen at 1000° C. and 40 torr to coat with titanium oxycarbide in a thickness of 1 micron, followed by cooling. Then it was further coated with aluminum oxide in a thickness of 1 micron by flowing a gaseous mixture of 5% of aluminum chloride, 3% of carbon dioxide, 12% of carbon monoxide and the balance hydrogen in another reactor at 1000° C. and 20 torr, thus obtaining an insert for cutting (Sample No. K).

On the other hand, the ISO P-30 cemented carbide substrate (Form No. SNU 432) containing no free carbon was similarly coated with titanium carbide in a thickness of 5 microns and, thereafter, coated with aluminum oxide in a thickness of 2 microns in another reactor, thus obtaining a cutting insert (Sample No. L).

Using these inserts, a forged material of S 35 C was cut under conditions of cutting speed=120 m/min, feed=0.30 mm/rev and depth of cut=1-3 mm and the life thereof was defined by the period of time when the flank wear reached 0.30 mm. Sample L was resistant to cutting for 165 minutes only, while Sample K according to the present invention was resistant to cutting for 218 minutes.

EXAMPLE 9

The same ISO P-30 cemented carbide substrate (Form No. SNU 432) containing 0.08% of free carbon, as used in Example 1, was coated with titanium carbide in a thickness of 5 microns in an analogous manner to Example 8 and then coated with titanium oxide in a thickness of 1 micron by flowing a gaseous mixture of 7% of titanium tetrachloride, 7% of carbon dioxide and the balance hydrogen at 1000° C. and 40 torr, followed by cooling. Thereafter, the coated insert was further coated with aluminum oxide with a thickness of 1 micron in another reactor in an analogous manner to Example 8, thus obtaining a cutting insert (Sample No. M).

On the other hand, the ISO P-30 cemented carbide substrate (Form No. SNU 432) containing no free carbon was similarly coated, thus obtaining a cutting insert (Sample No. N).

Using these inserts, a forged material of SCM 21 was cut under conditions of cutting speed=120 m/min, feed=0.30 mm/rev and depth of cut=1-3 mm and the life thereof was defined by the period of time when the flank wear reached 0.30 mm. Sample N was resistant to cutting for 226 minutes, while Sample M was resistant to cutting for 281 minutes.

What is claimed is:

1. A surface-coated cemented carbide article wherein the cemented carbon substrate initially containing free carbon in an amount of 0.01 to 0.50% by weight up to a depth of at least 50 microns from the surface and having at least one layer coated thereupon, which coating layer consists of at least one material selected from the group consisting of oxides, carbides, nitrides, carbonitrides and mixtures or compounds thereof, wherein the most interior coated layer, closest to the surface of the cemented carbide substrate, consists of at least one material selected from carbides and carbonitrides of Group IVa, Va and VIa elements, said article having being free of a decarburized layer called an $\eta$ phase located between the cemented carbide substrate and the most interior coating layer or containing such $\eta$ phase having a thickness of at most 0.5 micron in the case where the curvature of the interface is zero and the lattice constant of binder metal in the cemented carbide, as a mean value of from the interface to 50 microns, is not more than that of the iron group metal solid solution in the cemented carbide by at least 0.005 Å.

2. The surface-coated cemented carbide article as claimed in claim 1, wherein the cemented carbide substrate contains 0.05 to 0.35% by weight of free carbon.

3. The surface-coated cemented carbide article as claimed in claim 1, wherein the binder metal is cobalt and wherein the X-ray lattice constant of the cobalt phase as a binder phase up to a depth of 100 microns is at most 3.550 Å.

4. The surface-coated cemented carbide article as claimed in claim 1, wherein at least one intermediate layer is sandwiched in between the coating layers.

5. The surface-coated cemented carbide article as claimed in claim 1, wherein at least one layer consists of oxides of Group III to VI elements.

6. A process for producing the coated cemented carbide article of claim 1, which comprises coating a cemented carbide substrate with at least one layer of a material selected from the group consisting of oxides, carbides, nitrides carbonitrides and mixtures of compounds thereof by chemical vapor deposition, characterized in that the cemented carbide substrate contains free carbon in amounts of 0.01 to 0.50% by weight and up to a depth of at least 50 microns from the surface.

7. A process for the production of the surface-coated cemented carbide article as claimed in claim 6, characterized by subjecting the surface-coated cemented carbide article after coating to a diffusion treatment of carbon at 950° to 1100° C. for 0.5 to 10 hours.

* * * * *

UNITED STATES PATENT AND TRADEMARK OFFICE
CERTIFICATE OF CORRECTION

PATENT NO. : 4,150,195
DATED : April 17, 1979
INVENTOR(S) : Tobioka et al.

It is certified that error appears in the above-identified patent and that said Letters Patent is hereby corrected as shown below:

Cover page, column 1, underneath "[22] Filed June. 15, 1977", please insert the following:
-- [30] Foreign Application Priority Data
April 2, 1977 [JP] Japan . . . 52-37893
June 18, 1976 [JP] Japan . . . 51-72491
June 30, 1976 [JP] Japan . . . 51-78195
June 30, 1976 [JP] Japan . . . 51-78198 --

Signed and Sealed this

Second Day of August, 1988

Attest:

DONALD J. QUIGG

*Attesting Officer*     *Commissioner of Patents and Trademarks*